US012591004B2

(12) United States Patent
Fujimura et al.

(10) Patent No.: US 12,591,004 B2
(45) Date of Patent: Mar. 31, 2026

(54) MONITORING CIRCUIT, SEMICONDUCTOR INTEGRATED CIRCUIT DEVICE, AND VEHICLE

(71) Applicant: ROHM CO., LTD., Kyoto (JP)

(72) Inventors: Takashi Fujimura, Kyoto (JP); Takashi Kira, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 18/820,651

(22) Filed: Aug. 30, 2024

(65) Prior Publication Data

US 2024/0418772 A1 Dec. 19, 2024

Related U.S. Application Data

(63) Continuation of application No. PCT/JP2022/045459, filed on Dec. 9, 2022.

(30) Foreign Application Priority Data

Mar. 1, 2022 (JP) ................................. 2022-030980

(51) Int. Cl.
*G01R 31/28* (2006.01)
*G01R 31/00* (2006.01)
(Continued)

(52) U.S. Cl.
CPC ....... *G01R 31/2882* (2013.01); *G01R 31/007* (2013.01); *G06F 1/06* (2013.01); *H03K 21/023* (2013.01); *H03K 21/10* (2013.01)

(58) Field of Classification Search
CPC ................................................ G01R 31/2882
(Continued)

(56) References Cited

U.S. PATENT DOCUMENTS

2019/0094902 A1* 3/2019 Kaneko .............. G01R 31/3187

FOREIGN PATENT DOCUMENTS

JP 2020190828 A 11/2020

OTHER PUBLICATIONS

International Search Report for International Application No. PCT/JP2022/045459, mailed Jan. 24, 2023.
(Continued)

*Primary Examiner* — Tomi Skibinski
(74) *Attorney, Agent, or Firm* — CANTOR COLBURN LLP

(57) ABSTRACT

A monitoring circuit includes first and second oscillators, first and second frequency dividers, first and second counters, a determination portion, and an identification portion. The first and second frequency dividers respectively divide frequencies of first and second clock signals outputted from the first and second oscillators, respectively. The first and second counters respectively count the numbers of clocks of the second and first clock signals at first and second numbers of periods of first and second frequency-divided signals outputted from the first and second frequency dividers, respectively. The determination portion determines, based on results of counting by the first and second counters, whether or not an abnormality has occurred in either of the first and second clock signals. The identification portion identifies, at the occurrence of an abnormality in either of the first and second clock signals, which of the first and second clock signals is in an abnormal state.

10 Claims, 8 Drawing Sheets

(51) Int. Cl.
  *G06F 1/06*        (2006.01)
  *H03K 21/02*       (2006.01)
  *H03K 21/10*       (2006.01)
(58) Field of Classification Search
  USPC ........................................................ 327/291
  See application file for complete search history.

(56)                    References Cited

OTHER PUBLICATIONS

PCT Written Opinion of the International Searching Authority for
International Application No. PCT/JP2022/045459, mailed Jan. 24,
2023.

* cited by examiner

FIG. 3

| State of Clock Signal | Output OUT4A of 1st Counter 4A | Output OUT4B of 2nd Counter 4B | Output OUT4C of 3rd Counter 4C | Output of Selector 6 | Result of Detection by Combinational Circuit 5 |
|---|---|---|---|---|---|
| Usual State | Abnormality Not Detected (Low Level) | Abnormality Not Detected (Low Level) | Abnormality Not Detected (Low Level) | 1st Clock Signal CLK1 | Abnormality Not Detected (Low Level) |
| Frequency of 1st Clock Signal CLK1 Is High | Abnormality Detected (High Level) | Abnormality Detected (High Level) | Abnormality Not Detected (Low Level) | 2nd Clock Signal CLK2 | Abnormality Detected (High Level) |
| Frequency of 1st Clock Signal CLK1 Is Low | Abnormality Detected (High Level) | Abnormality Detected (High Level) | Abnormality Not Detected (Low Level) | 2nd Clock Signal CLK2 | Abnormality Detected (High Level) |
| 1st Clock Signal CLK1 Is Fixed to Low Level | Abnormality Detected (High Level) | Abnormality Detected (High Level) | Abnormality Not Detected (Low Level) | 2nd Clock Signal CLK2 | Abnormality Detected (High Level) |
| 1st Clock Signal CLK1 Is Fixed to High Level | Abnormality Detected (High Level) | Abnormality Detected (High Level) | Abnormality Not Detected (Low Level) | 2nd Clock Signal CLK2 | Abnormality Detected (High Level) |
| Frequency of 2nd Clock Signal CLK2 Is High | Abnormality Detected (High Level) | Abnormality Detected (High Level) | Abnormality Detected (High Level) | 1st Clock Signal CLK1 | Abnormality Detected (High Level) |
| Frequency of 2nd Clock Signal CLK2 Is Low | Abnormality Detected (High Level) | Abnormality Detected (High Level) | Abnormality Detected (High Level) | 1st Clock Signal CLK1 | Abnormality Detected (High Level) |
| 2nd Clock Signal CLK2 Is Fixed to Low Level | Abnormality Detected (High Level) | Abnormality Detected (High Level) | Abnormality Detected (High Level) | 1st Clock Signal CLK1 | Abnormality Detected (High Level) |
| 2nd Clock Signal CLK2 Is Fixed to High Level | Abnormality Detected (High Level) | Abnormality Detected (High Level) | Abnormality Detected (High Level) | 1st Clock Signal CLK1 | Abnormality Detected (High Level) |
| Frequency of 3rd Clock Signal CLK3 Is High | Abnormality Not Detected (Low Level) | Abnormality Not Detected (Low Level) | Abnormality Detected (High Level) | 1st Clock Signal CLK1 | Abnormality Detected (High Level) |
| Frequency of 3rd Clock Signal CLK3 Is Low | Abnormality Not Detected (Low Level) | Abnormality Not Detected (Low Level) | Abnormality Detected (High Level) | 1st Clock Signal CLK1 | Abnormality Detected (High Level) |
| 3rd Clock Signal CLK3 Is Fixed to Low Level | Abnormality Not Detected (Low Level) | Abnormality Not Detected (Low Level) | Abnormality Detected (High Level) | 1st Clock Signal CLK1 | Abnormality Detected (High Level) |
| 3rd Clock Signal CLK3 Is Fixed to High Level | Abnormality Not Detected (Low Level) | Abnormality Not Detected (Low Level) | Abnormality Detected (High Level) | 1st Clock Signal CLK1 | Abnormality Detected (High Level) |

FIG. 5

| State of Clock Signal | Output OUT4A of 1st Counter 4A | Output OUT4B of 2nd Counter 4B | Output OUT7A of 1st Charging and Discharging Circuit 7A | Output OUT7B of 2nd Charging and Discharging Circuit 7B | Output of Selector 6 | Result of Detection by OR Gate 8 |
|---|---|---|---|---|---|---|
| Usual State | Abnormality Not Detected (Low Level) | Abnormality Not Detected (Low Level) | Abnormality Not Detected (Low Level) | Abnormality Not Detected (Low Level) | 1st Clock Signal CLK1 | Abnormality Not Detected (Low Level) |
| Frequency of 1st Clock Signal CLK1 Is High | Abnormality Detected (High Level) | Abnormality Detected (High Level) | Abnormality Detected (High Level) | Abnormality Not Detected (Low Level) | 2nd Clock Signal CLK2 | Abnormality Detected (High Level) |
| Frequency of 1st Clock Signal CLK1 Is Low | Abnormality Detected (High Level) | Abnormality Detected (High Level) | Abnormality Detected (High Level) | Abnormality Not Detected (Low Level) | 2nd Clock Signal CLK2 | Abnormality Detected (High Level) |
| 1st Clock Signal CLK1 Is Fixed to Low Level | Abnormality Detected (High Level) | Abnormality Detected (High Level) | Abnormality Detected (High Level) | Abnormality Not Detected (Low Level) | 2nd Clock Signal CLK2 | Abnormality Detected (High Level) |
| 1st Clock Signal CLK1 Is Fixed to High Level | Abnormality Detected (High Level) | Abnormality Detected (High Level) | Abnormality Detected (High Level) | Abnormality Not Detected (Low Level) | 2nd Clock Signal CLK2 | Abnormality Detected (High Level) |
| Frequency of 2nd Clock Signal CLK2 Is High | Abnormality Detected (High Level) | Abnormality Detected (High Level) | Abnormality Not Detected (Low Level) | Abnormality Detected (High Level) | 1st Clock Signal CLK1 | Abnormality Detected (High Level) |
| Frequency of 2nd Clock Signal CLK2 Is Low | Abnormality Detected (High Level) | Abnormality Detected (High Level) | Abnormality Not Detected (Low Level) | Abnormality Detected (High Level) | 1st Clock Signal CLK1 | Abnormality Detected (High Level) |
| 2nd Clock Signal CLK2 Is Fixed to Low Level | Abnormality Detected (High Level) | Abnormality Detected (High Level) | Abnormality Not Detected (Low Level) | Abnormality Detected (High Level) | 1st Clock Signal CLK1 | Abnormality Detected (High Level) |
| 2nd Clock Signal CLK2 Is Fixed to High Level | Abnormality Detected (High Level) | Abnormality Detected (High Level) | Abnormality Not Detected (Low Level) | Abnormality Detected (High Level) | 1st Clock Signal CLK1 | Abnormality Detected (High Level) |

MONITORING CIRCUIT, SEMICONDUCTOR INTEGRATED CIRCUIT DEVICE, AND VEHICLE

CROSS-REFERENCE TO RELATED APPLICATIONS

This application is a continuation under 35 U.S.C. § 120 of No. PCT/JP2022/045459 filed on Dec. 9, 2022, which is incorporated herein by reference, and which claimed priority to Japanese Patent Application No. 2022-030980 filed in Japan on Mar. 1, 2022. The present application likewise claims priority under 35 U.S.C. § 119 to Japanese Application No. 2022-030980 filed in Japan on Mar. 1, 2022, the entire content of which is also incorporated herein by reference, the entire contents of which are hereby incorporated by reference.

BACKGROUND OF THE INVENTION

1. Technical Field

The disclosure herein relates to a monitoring circuit and to a semiconductor integrated circuit device and a vehicle each including the monitoring circuit.

2. Description of Related Art

In the field of in-vehicle devices, it has been demanded to monitor an operation state of an IC (Integrated Circuit) and to perform, at the occurrence of an abnormality, a protective operation against the abnormality. Furthermore, particularly in products requested to achieve a level of functional safety standardized by ISO 26262 and so on, it is desired not only to simply perform the protective operation at the occurrence of an abnormality but also to maintain an operation even at the occurrence of an abnormality.

As a circuit that performs abnormality monitoring, generally used is a circuit that operates based on a clock signal outputted from an oscillator. Accordingly, in a case of an abnormal stop of the oscillator, it is no longer possible to perform the abnormality monitoring and thus to perform the protective operation or maintain an operation. It is, therefore, extremely crucial to maintain an operation of the oscillator.

BRIEF DESCRIPTION OF THE DRAWINGS

FIG. 3 is a view showing combinational logic of a combinational circuit in the first embodiment.

FIG. 5 is a view showing combinational logic of a combinational circuit in the second embodiment.

DESCRIPTION OF EMBODIMENTS

In the present description, a reference voltage refers to a voltage that is constant in an ideal state and is practically a voltage that may slightly vary depending on a temperature change or the like.

In the present description, a constant current refers to a current that is constant in an ideal state and is practically a current that may slightly vary depending on a temperature change or the like.

First Embodiment

Figure 1:
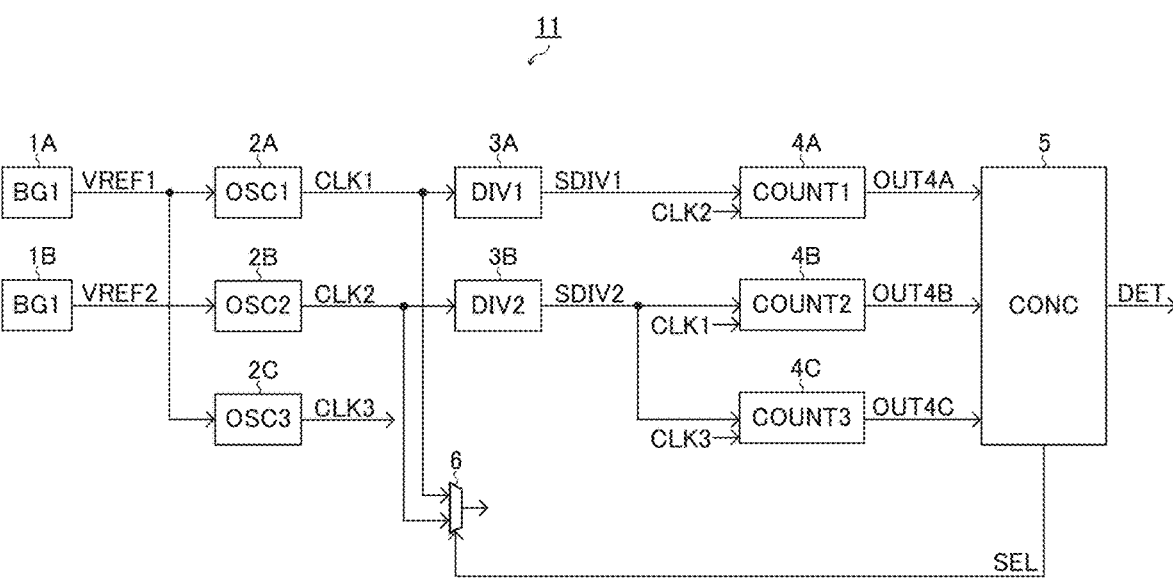
FIG. 1 is a view showing a configuration of a monitoring circuit according to a first embodiment.

FIG. 1 is a view showing a configuration of a monitoring circuit 11 according to a first embodiment (hereinafter, referred to as a monitoring circuit 11). The monitoring circuit 11 includes first and second reference voltage sources 1A and 1B, first to third oscillators 2A to 2C, first and second frequency dividers 3A and 3B, first to third counters 4A to 4C, a combinational circuit 5, and a selector 6.

The first reference voltage source 1A generates a first reference voltage VREF1. While this embodiment uses a bandgap reference circuit as the first reference voltage source 1A, any other type of reference voltage source than the bandgap reference circuit may be used as the first reference voltage source 1A. The first reference voltage VREF1 is supplied to each of the first oscillator 2A and the third oscillator 2C.

The second reference voltage source 1B generates a second reference voltage VREF2. While this embodiment uses a bandgap reference circuit as the second reference voltage source 1B, any other type of reference voltage source than the bandgap reference circuit may be used as the second reference voltage source 1B. The second reference voltage VREF2 is supplied to the second oscillator 2B.

A set value of the second reference voltage VREF2 may be equal to or different from a set value of the first reference voltage VREF1.

The first oscillator 2A operates upon receipt of supply of the first reference voltage VREF1 and generates a first clock signal CLK1. The first oscillator 2A outputs the first clock signal CLK1.

The second oscillator 2B operates upon receipt of supply of the second reference voltage VREF2 and generates a second clock signal CLK2. The second oscillator 2B outputs the second clock signal CLK2.

The third oscillator 2C operates upon receipt of supply of the first reference voltage VREF1 and generates a third clock signal CLK3. The third oscillator 2C outputs the third clock signal CLK3.

A set frequency of the first clock signal CLK1 is equal to a set frequency of the second clock signal CLK2. A set frequency of the third clock signal CLK3 may be equal to or different from each of the set frequency of the first clock signal CLK1 and the set frequency of the second clock signal CLK2. In the following description, it is assumed that the set frequency of the third clock signal CLK3 is equal to each of the set frequency of the first clock signal CLK1 and the set frequency of the second clock signal CLK2.

The first frequency divider 3A divides a frequency of the first clock signal CLK1 so as to generate a first frequency-divided signal SDIV1. The first frequency divider 3A outputs the first frequency-divided signal SDIV1.

The second frequency divider 3B divides a frequency of the second clock signal CLK2 so as to generate a second frequency-divided signal SDIV2. The second frequency divider 3B outputs the second frequency-divided signal SDIV2.

The first counter 4A counts the number of clocks of the second clock signal CLK2 at a first number of periods of the first frequency-divided signal SDIV1. While the first number of periods is one period in this embodiment, the first number of periods may be, for example, a half period, two periods, or three periods. Furthermore, this embodiment assumes that the first frequency divider 3A divides a frequency by five. Accordingly, in a case where the first clock signal CLK1 and the second clock signal CLK2 are in usual states, the first counter 4A has a number of counts of ten. In consideration of various types of existing errors, for example, when the first counter 4A has a number of counts not less than nine and not more than 11, the first clock signal CLK1 and the second clock signal CLK2 may be regarded as being in the usual states.

The second counter 4B counts the number of clocks of the first clock signal CLK1 at a second number of periods of the second frequency-divided signal SDIV2. While the second number of periods is one period in this embodiment, the second number of periods may be, for example, a half period, two periods, or three periods. Furthermore, this embodiment assumes that the second frequency divider 3B divides a frequency by five. Accordingly, in the case where the first clock signal CLK1 and the second clock signal CLK2 are in the usual states, the second counter 4B has a number of counts of ten. In consideration of various types of existing errors, for example, when the second counter 4B has a number of counts not less than nine and not more than 11, the first clock signal CLK1 and the second clock signal CLK2 may be regarded as being in the usual states.

The third counter 4C counts the number of clocks of the third clock signal CLK3 at a third number of periods of the second frequency-divided signal SDIV2. While the third number of periods is one period in this embodiment, the third number of periods may be, for example, a half period, two periods, or three periods. Furthermore, this embodiment assumes that the second frequency divider 3B divides a frequency by five. Accordingly, in a case where the second clock signal CLK2 and the third clock signal CLK3 are in usual states, the third counter 4C has a number of counts of ten. In consideration of various types of existing errors, for example, when the third counter 4C has a number of counts not less than nine and not more than 11, the second clock signal CLK2 and the third clock signal CLK3 may be regarded as being in the usual states.

Figure 2:
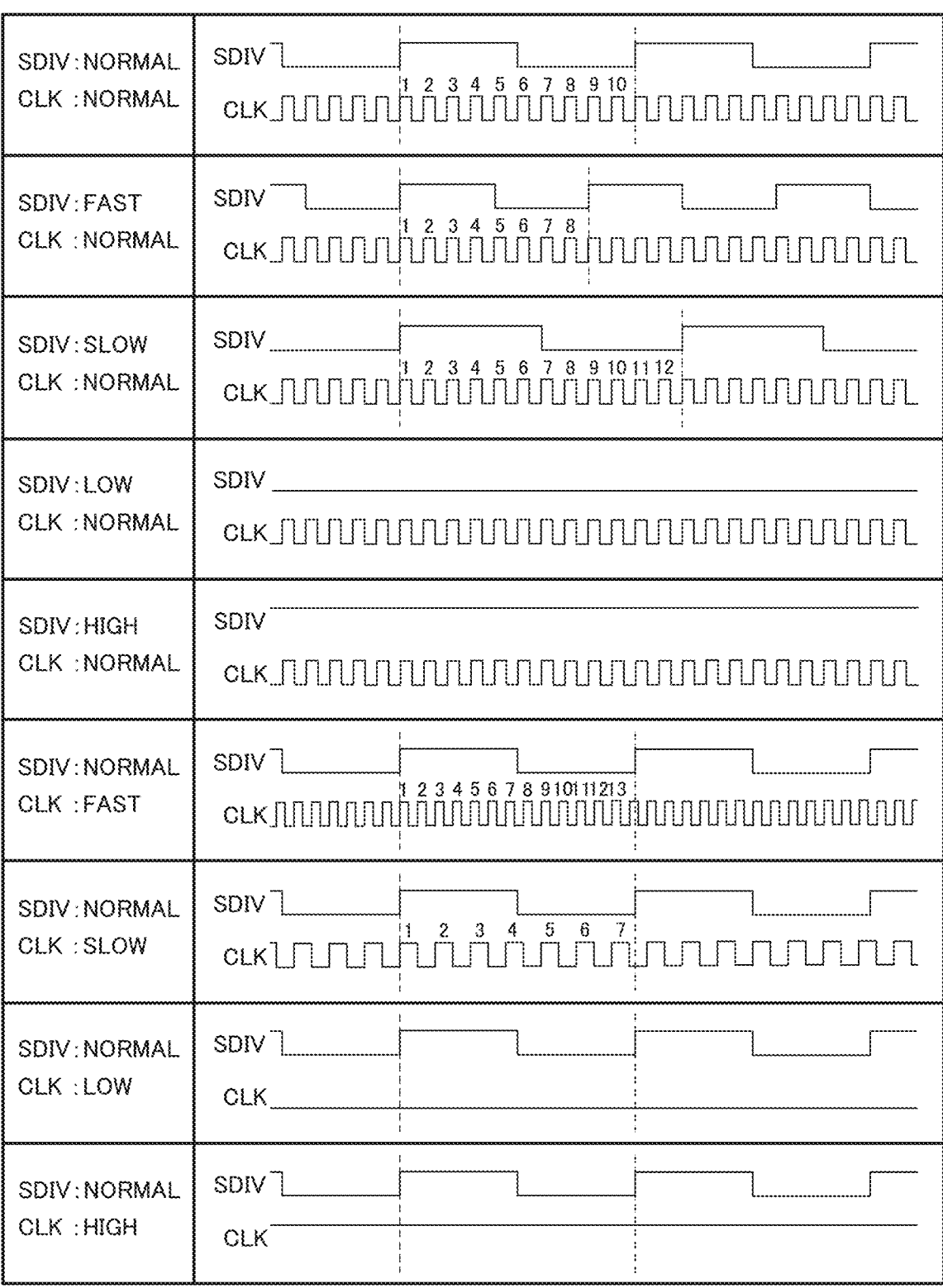
FIG. 2 is a view showing a relationship between a frequency-divided signal and a clock signal.

FIG. 2 is a view showing a relationship between a frequency-divided signal SDIV and a clock signal CLK supplied to each of the first to third counters 4A to 4C.

In a case where the frequency-divided signal SDIV and the clock signal CLK are in usual states, each of the counters outputs a low-level signal.

In a case where the frequency-divided signal SDIV has a frequency higher than usual and the clock signal CLK is in the usual state, each of the counters has a number of counts smaller than usual and outputs a high-level signal.

In a case where the frequency-divided signal SDIV has a frequency lower than usual and the clock signal CLK is in the usual state, each of the counters has a number of counts larger than usual and outputs a high-level signal.

In a case where the frequency-divided signal SDIV is fixed to a low level and the clock signal CLK is in the usual state, each of the counters has a number of counts of 0 and outputs a high-level signal.

In a case where the frequency-divided signal SDIV is fixed to a high level and the clock signal CLK is in the usual state, each of the counters has a number of counts of 0 and outputs a high-level signal.

In a case where the frequency-divided signal SDIV is in the usual state and the clock signal CLK has a frequency higher than usual, each of the counters has a number of counts larger than usual and outputs a high-level signal.

In a case where the frequency-divided signal SDIV is in the usual state and the clock signal CLK has a frequency lower than usual, each of the counters has a number of counts smaller than usual and outputs a high-level signal.

In a case where the frequency-divided signal SDIV is in the usual state and the clock signal CLK is fixed to a low level, each of the counters has a number of counts of 0 and outputs a high-level signal.

In a case where the frequency-divided signal SDIV is in the usual state and the clock signal CLK is fixed to a high level, each of the counters has a number of counts of 0 and outputs a high-level signal.

Referring back to FIG. 1, a further description is given of the configuration of the monitoring circuit 11.

The combinational circuit 5 receives an output OUT4A of the first counter 4A, an output OUT4B of the second counter 4B, and an output OUT4C of the third counter 4C. FIG. 3 is a view showing combinational logic of the combinational circuit 5.

When at least one of the output OUT4A of the first counter 4A, the output OUT4B of the second counter 4B, and the output OUT4C of the third counter 4C is at a high level, the combinational circuit 5 sets a detection result DET to a high level. That is, the detection result DET at the high level indicates that an abnormality has occurred in at least one of the first to third clock signals CLK1 to CLK3. Furthermore, the detection result DET at a low level indicates that no abnormality has occurred in the first to third clock signals CLK1 to CLK3.

In a case where the output OUT4A of the first counter 4A and the output OUT4B of the second counter 4B are both at the high level, the combinational circuit 5 determines that an abnormality has occurred in either of the first clock signal CLK1 and the second clock signal CLK2.

Furthermore, in a case where an abnormality has occurred in either of the first clock signal CLK1 and the second clock signal CLK2, when the output OUT4C of the third counter 4C is at a low level, the combinational circuit 5 identifies that the second clock signal CLK2 and the third clock signal CLK3 are in normal states and the first clock signal CLK1 is in an abnormal state. Then, the combinational circuit 5 outputs, as a selection signal SEL, a signal for causing the selector 6 to output the second clock signal CLK2.

On the other hand, in the case where an abnormality has occurred in either of the first clock signal CLK1 and the second clock signal CLK2, when the output OUT4C of the third counter 4C is at the high level, the combinational circuit 5 identifies that the second clock signal CLK2 is in the abnormal state. Then, the combinational circuit 5 outputs, as the selection signal SEL, a signal for causing the selector 6 to output the first clock signal CLK1.

Based on the selection signal SEL outputted from the combinational circuit 5, the selector 6 selects either one of the first clock signal CLK1 and the second clock signal CLK2. The selection signal SEL outputted from the combinational circuit 5 is a signal based on a result of identification by the combinational circuit 5. Accordingly, based on a result of identification by the combinational circuit 5, the selector 6 selects either one of the first clock signal CLK1 and the second clock signal CLK2. To be more specific, based on a result of identification by the combinational circuit 5, the selector 6 selects a normal-state clock signal from the first clock signal CLK1 and the second clock signal CLK2. This makes it possible to continuously use a normal-state clock signal even at the occurrence of an abnormality in either one of the first clock signal CLK1 and the second clock signal CLK2.

While this embodiment has a configuration in which the selection signal SEL is directly supplied to the selector 6, for example, a microcomputer may receive the selection signal SEL so as to control the selector 6 based on the selection signal SEL.

The monitoring circuit 11 does not require provision of a charging and discharging circuit and thus can be reduced in circuit scale.

Furthermore, the monitoring circuit 11 uses separate reference voltage sources for the first oscillator 2A and the second oscillator 2B, and thus the reference voltage sources each would not constitute a cause of failure common to the first oscillator 2A and the second oscillator 2B. This enhances an abnormality detection capability of the monitoring circuit 11.

Furthermore, in the monitoring circuit 11, one of the reference voltage sources may constitute a cause of failure common to the first oscillator 2A and the third oscillator 2C, and one of the frequency dividers may constitute a cause of failure common to the second counter 4B and the third counter 4C. Nesting the common causes of failure in this manner further enhances the abnormality detection capability of the monitoring circuit 11.

Second Embodiment

Figure 4:
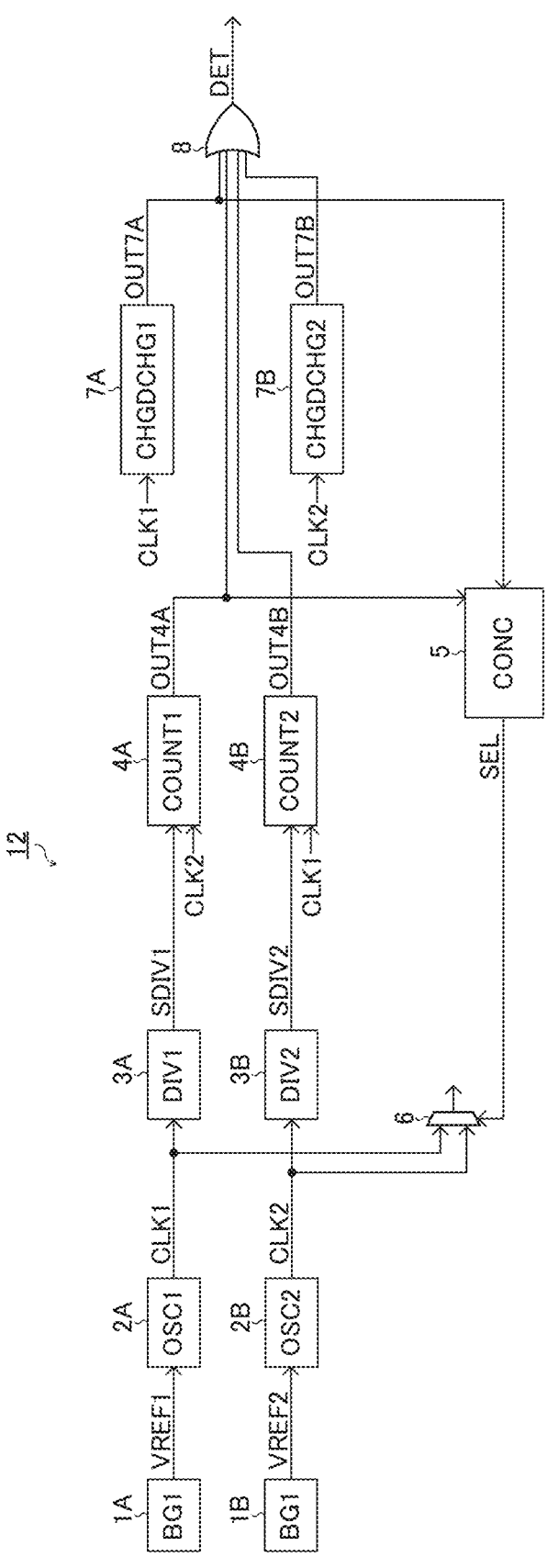
FIG. 4 is a view showing a configuration of a monitoring circuit according to a second embodiment.

FIG. 4 is a view showing a configuration of a monitoring circuit 12 according to a second embodiment (hereinafter, referred to as a monitoring circuit 12). In FIG. 4, like reference signs denote like parts as in FIG. 1, which, therefore, will not be described in detail.

The monitoring circuit 12 has a configuration obtained by excluding the third counter 4C from the monitoring circuit 11 and additionally including a first charging and discharging circuit 7A, a second charging and discharging circuit 7B, and an OR gate 8. Furthermore, combinational logic of a combinational circuit 5 in this embodiment is different from the combinational logic of the combinational circuit 5 in the first embodiment. FIG. 5 is a view showing the combinational logic of the combinational circuit 5 in the second embodiment.

The first charging and discharging circuit 7A performs charging and discharging based on a first clock signal CLK1. The second charging and discharging circuit 7B performs charging and discharging based on a second clock signal CLK2.

When at least one of respective outputs of a first counter 4A, a second counter 4B, the first charging and discharging circuit 7A, and the second charging and discharging circuit 7B is a signal indicating detection of an abnormality, the OR gate 8 sets to a high level a detection result DET as an output signal of the OR gate 8.

Figure 6:
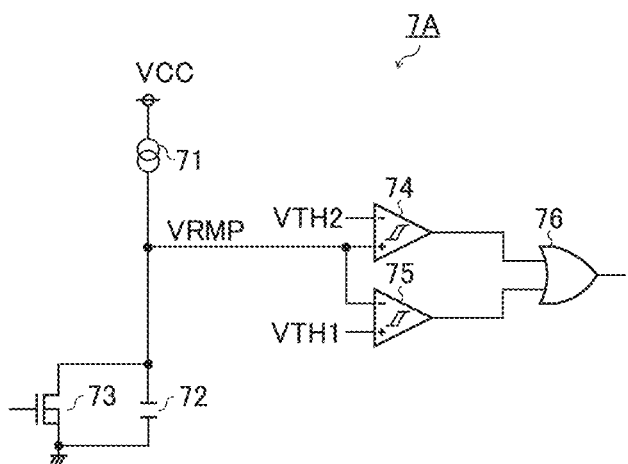
FIG. 6 is a view showing a configuration example of a first charging and discharging circuit.

FIG. 6 is a view showing a configuration example of the first charging and discharging circuit 7A. The first charging and discharging circuit 7A according to the configuration example shown in FIG. 6 includes a constant current source 71, a capacitor 72, a MOSFET 73, hysteresis comparators 74 and 75, and an OR gate 76.

A power supply voltage VCC is applied to one end of the constant current source 71. The other end of the constant current source 71 is connected to one end of the capacitor 72. The other end of the capacitor 72 is connected to a ground potential.

Figure 7:
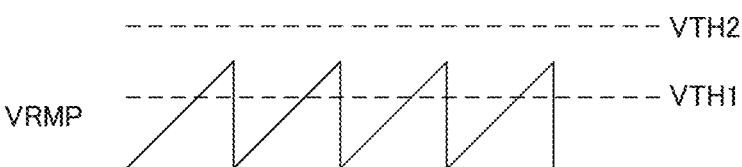
FIG. 7 is a waveform diagram of a ramp voltage.

The MOSFET 73 is connected in parallel to the capacitor 72. When the MOSFET 73 is in an off state, the capacitor 72 is charged with a constant current outputted from the constant current source 71. When the MOSFET 73 is in an on state, the capacitor 72 performs discharging. One continuous off time of the MOSFET 73 is equal in length to one period of the first clock signal CLK1. The MOSFET 73 is turned on, for example, in synchronization with a rising edge of the first clock signal CLK1. With this configuration, a ramp voltage VRMP having a waveform shown in FIG. 7 is generated at a connection node between the constant current source 71 and the capacitor 72.

When the ramp voltage VRMP exceeds a second threshold voltage VTH2, the hysteresis comparator 74 outputs a high-level signal. In a case where the first clock signal CLK1 has a frequency lower than usual, an output signal of the hysteresis comparator 74 is at a high level. Two comparators may be used in place of the hysteresis comparator 74.

When the ramp voltage VRMP becomes smaller than a first threshold voltage VTH1 (<VTH2), the hysteresis comparator 75 outputs a high-level signal. In a case where the first clock signal CLK1 has a frequency higher than usual, an output signal of the hysteresis comparator 75 is at a high level. Two comparators may be used in place of the hysteresis comparator 75.

The OR gate 76 outputs a logical sum of an output of the hysteresis comparator 74 and an output of the hysteresis comparator 75. An output of the OR gate 76 is outputted as the output of the first charging and discharging circuit 7A. Accordingly, in a case where the first clock signal CLK1 is in an abnormal state, the output of the first charging and discharging circuit 7A is at a high level.

A configuration example of the second charging and discharging circuit 7B is similar to the configuration example of the first charging and discharging circuit 7A. In the second charging and discharging circuit 7B, however, the MOSFET 73 is turned on/off based not on the first clock signal CLK1 but on the second clock signal CLK2. The first charging and discharging circuit 7A and the second charging and discharging circuit 7B may be configured differently from each other.

There may be adopted a configuration in which, unlike in this embodiment, the second charging and discharging circuit 7B is not provided. There may also be adopted a configuration in which the first charging and discharging circuit 7A is not provided, and the output of the second charging and discharging circuit 7B is supplied to the combinational circuit 5.

Application Example, Etc.

Figure 8:
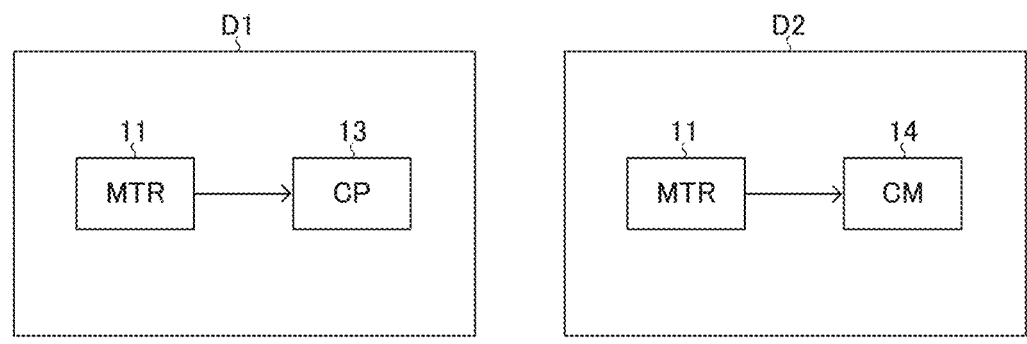
FIG. 8 is a view showing schematic configurations of semiconductor integrated circuit devices.

FIG. 8 is a view showing schematic configurations of semiconductor integrated circuit devices D1 and D2. The semiconductor integrated circuit device D1 includes the monitoring circuit 11 and a charge pump circuit 13 that operates based on a clock signal outputted from the monitoring circuit 11. The semiconductor integrated circuit device D2 includes the monitoring circuit 11 and a communication circuit 14 that operates based on a clock signal outputted from the monitoring circuit 11. In each of the semiconductor integrated circuit devices D1 and D2, the monitoring circuit 12 may be used in place of the monitoring circuit 11.

Figure 9:
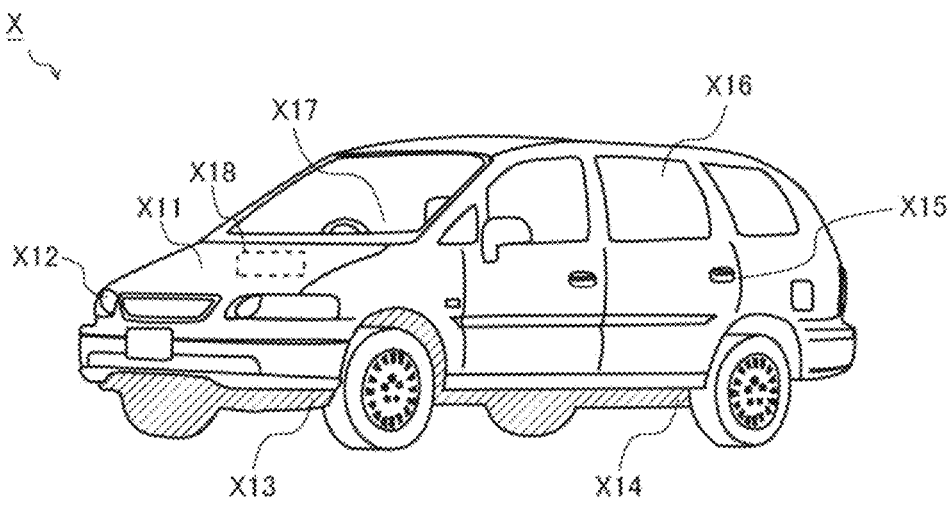
FIG. 9 is an external appearance view of a vehicle.

FIG. 9 is an external appearance view of a vehicle X. The vehicle X according to this configuration example mounts therein various types of electronic devices X11 to X18 that operate upon receipt of supply of voltages outputted from an unshown battery. For the sake of convenience of drawing, respective mounting positions of the electronic devices X11 to X18 shown in this figure may be different from actual mounting positions thereof.

The electronic device X11 is an engine control unit that performs engine-related control (such as injection control, electronic throttle control, idling control, oxygen sensor heater control, and auto cruise control).

The electronic device X12 is a lamp control unit that controls turning on/off of an HID [high intensity discharged lamp], a DRL [daytime running lamp], or the like.

The electronic device X13 is a transmission control unit that performs transmission-related control.

The electronic device X14 is a brake unit that performs control related to motion of the vehicle X (such as ABS [anti-lock brake system] control and electronic suspension control).

The electronic device X15 is a security control unit that performs drive control of a door lock, an anti-theft alarm, and so on.

The electronic device X16 is an electronic device incorporated in the vehicle X at a factory shipping stage as a piece of standard equipment or a manufacturer optional product, examples of which include a wiper, an electric door mirror, a power window, a damper (a shock absorber), an electric sunroof, and an electric seat.

The electronic device X17 is an electronic device optionally mounted in the vehicle X as a user optional product, examples of which include an in-vehicle A/V [audio/visual] device, a car navigation system, and an ETC [electronic toll collection system].

The electronic device X18 is an electronic device including a high-withstand-voltage motor, examples of which include an EPS [Electric Power Steering], an in-vehicle blower, an oil pump, a water pump, and a battery cooling fan.

The earlier described monitoring circuit 11 or monitoring circuit 12 can be incorporated in, among the electronic devices X11 to X18, any device requiring an oscillator. From the standpoint of functional safety, it is desirable to incorporate the monitoring circuit 11 or the monitoring circuit 12 in particularly at least one of the electronic device X13 and the electronic device X14.

The above-described embodiments are to be construed in all respects as illustrative and not limiting. It is to be understood that the technical scope of the disclosure herein is indicated by the appended claims rather than by the foregoing description of the embodiments, and all changes that come within the meaning and range of equivalency of the claims are intended to be embraced therein.

Figure 10:
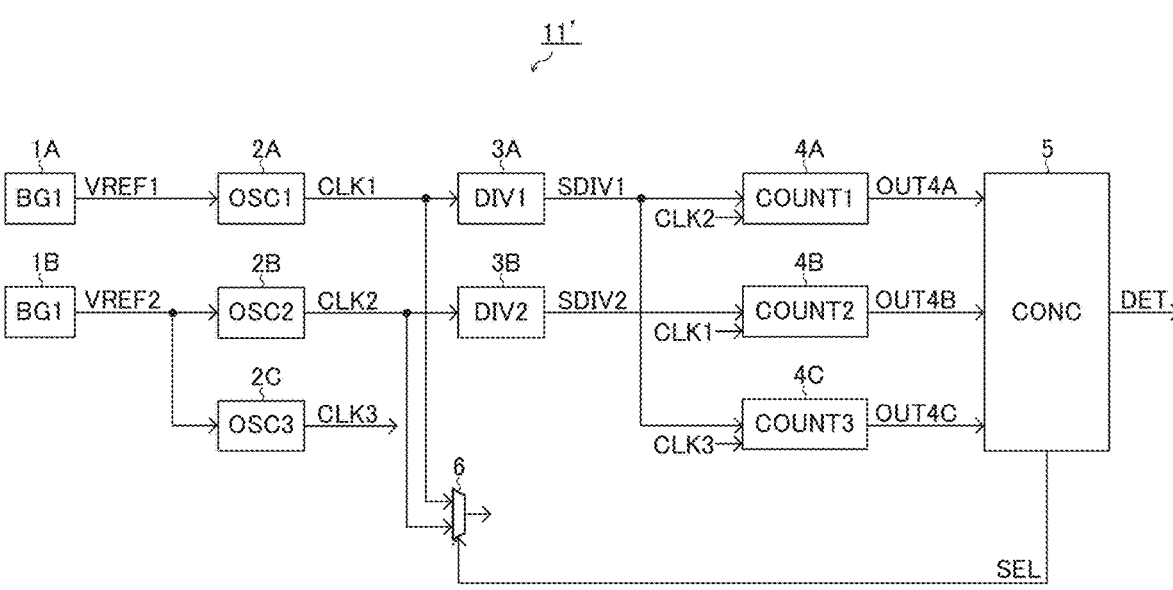
FIG. 10 is a view showing a configuration of a monitoring circuit according to a modification example.

The earlier described monitoring circuit 11 has a configuration in which the first reference voltage source 1A may constitute a cause of failure common to the first oscillator 2A and the third oscillator 2C, and the second frequency divider 3B may constitute a cause of failure common to the second counter 4B and the third counter 4C. For example, there may be adopted a configuration of a monitoring circuit 11' shown in FIG. 10 in which common causes of failure are different from those in the monitoring circuit 11. In the monitoring circuit 11', a third counter 4C counts the number of clocks of a third clock signal CLK3 at a fourth number of periods of a first frequency-divided signal SDIV1. The fourth number of periods may be, for example, one period or may be a half period, two periods, or three periods.

The monitoring circuit 11' has a configuration in which a second reference voltage source 1B may constitute a cause of failure common to a second oscillator 2B and a third oscillator 2C, and a first frequency divider 3A may constitute a cause of failure common to a first counter 4A and the third counter 4C. Similarly to the monitoring circuit 11, the monitoring circuit 11' is configured to nest the common causes of failure. Accordingly, the monitoring circuit 11' has the same level of abnormality detection capability as that of the monitoring circuit 11.

A monitoring circuit (11, 12) as described thus far has a configuration (a first configuration) including a first oscillator (2A) configured to output a first clock signal, a second oscillator (2B) configured to output a second clock signal, a first frequency divider (3A) configured to divide a frequency of the first clock signal, a second frequency divider (3B) configured to divide a frequency of the second clock signal, a first counter (4A) configured to count the number of clocks of the second clock signal at a first number of periods of a first frequency-divided signal outputted from the first frequency divider, a second counter (4B) configured to count the number of clocks of the first clock signal at a second number of periods of a second frequency-divided signal outputted from the second frequency divider, a determination portion (5, 8) configured to determine, based on results of counting by the first counter and the second counter, whether or not an abnormality has occurred in either of the first clock signal and the second clock signal, and an identification portion (2C, 4C, 5, 7A, 7B) configured to identify, at the occurrence of an abnormality in either of the first clock signal and the second clock signal, which of the first clock signal and the second clock signal is in an abnormal state.

The monitoring circuit according to the above-described first configuration is capable of monitoring in which of the first clock signal and the second clock signal an abnormality has occurred.

The monitoring circuit according to the above-described first configuration may have a configuration (a second configuration) in which the identification portion includes a third oscillator (2C) configured to output a third clock signal and a third counter (4C) configured to count the number of clocks of the third clock signal at a third number of periods of the second frequency-divided signal or a fourth number of periods of the first frequency-divided signal, and is configured to identify, based on results of counting by the first counter, the second counter, and the third counter, at the occurrence of an abnormality in either of the first clock signal and the second clock signal, which of the first clock signal and the second clock signal is in the abnormal state.

The monitoring circuit according to the above-described second configuration does not require provision of a charging and discharging circuit and thus can be reduced in circuit scale.

The monitoring circuit according to the above-described second configuration may have a configuration (a third configuration) in which the first oscillator is configured to oscillate based on a first reference voltage supplied from a first reference voltage source (1A), and the second oscillator is configured to oscillate based on a second reference voltage supplied from a second reference voltage source (1B).

In the monitoring circuit according to the above-described third configuration, the reference voltage sources each would not constitute a cause of failure common to the first oscillator and the second oscillator. This can enhance an abnormality detection capability of the monitoring circuit.

The monitoring circuit according to the above-described third configuration may have a configuration (a fourth configuration) in which the third counter is configured to count the number of clocks of the third clock signal at the third number of periods of the second frequency-divided signal, and the third oscillator is configured to oscillate based on the first reference voltage, or alternatively, the third counter is configured to count the number of clocks of the third clock signal at the fourth number of periods of the first frequency-divided signal, and the third oscillator is configured to oscillate based on the second reference voltage.

In the monitoring circuit according to the above-described fourth configuration, in a case where the third counter counts the number of clocks of the third clock signal at the third number of periods of the second frequency-divided signal, one of the reference voltage sources may constitute a cause of failure common to the first oscillator and the third oscillator, and one of the frequency dividers may constitute a cause of failure common to the second counter and the third counter. Furthermore, in the monitoring circuit according to the above-described fourth configuration, in a case where the third counter counts the number of clocks of the third clock signal at the fourth number of periods of the first frequency-divided signal, one of the reference voltage sources may constitute a cause of failure common to the second oscillator and the third oscillator, and one of the frequency dividers may constitute a cause of failure common to the first counter and the third counter. Nesting the common causes of failure in this manner further enhances the abnormality detection capability of the monitoring circuit.

The monitoring circuit according to the above-described first configuration may have a configuration (a fifth configuration) in which the identification portion includes at least one of a first charging and discharging circuit (7A) configured to perform charging and discharging based on the first clock signal and a second charging and discharging circuit (7B) configured to perform charging and discharging based on the second clock signal, and is configured to identify, based on an output of at least one of the first charging and discharging circuit and the second charging and discharging circuit, at the occurrence of an abnormality in either of the first clock signal and the second clock signal, which of the first clock signal and the second clock signal is in the abnormal state.

The monitoring circuit according to the above-described fifth configuration is capable of identifying, without requiring provision of the third counter, which of the first clock signal and the second clock signal is in the abnormal state.

The monitoring circuit according to the above-described fifth configuration may have a configuration (a sixth configuration) in which the first oscillator is configured to oscillate based on a first reference voltage supplied from a first reference voltage source (1A), and the second oscillator is configured to oscillate based on a second reference voltage supplied from a second reference voltage source (1B).

In the monitoring circuit according to the above-described sixth configuration, the reference voltage sources each would not constitute a cause of failure common to the first clock signal and the second clock signal. This can enhance the abnormality detection capability of the monitoring circuit.

The monitoring circuit according to any of the above-described first to sixth configurations may have a configuration (a seventh configuration) including a selector (6) configured to select either one of the first clock signal and the second clock signal.

The monitoring circuit according to the above-described seventh configuration is capable of switching a clock signal to be used.

The monitoring circuit according to the above-described seventh configuration may have a configuration (an eighth configuration) in which, upon determination by the determination portion that an abnormality has occurred in either of the first clock signal and the second clock signal, based on a result of identification by the identification portion, the selector selects a normal-state clock signal from the first clock signal and the second clock signal.

The monitoring circuit according to the above-described eighth configuration is capable of continuous use of a normal-state clock signal even at the occurrence of an abnormality in either one of the first clock signal and the second clock signal.

A semiconductor integrated circuit device (D1, D2) as described thus far has a configuration (a ninth configuration) including the monitoring circuit according to any of the above-described first to eighth configurations.

The semiconductor integrated circuit device according to the above-described ninth configuration is capable of monitoring in which of the first clock signal and the second clock signal an abnormality has occurred.

A vehicle (X) as described thus far has a configuration (a tenth configuration) including the monitoring circuit according to any of the above-described first to eighth configurations.

The vehicle according to the above-described tenth configuration is capable of monitoring, in the monitoring circuit, in which of the first clock signal and the second clock signal an abnormality has occurred.

What is claimed is:

1. A monitoring circuit, comprising:
a first oscillator configured to output a first clock signal;
a second oscillator configured to output a second clock signal;
a first frequency divider configured to divide a frequency of the first clock signal;
a second frequency divider configured to divide a frequency of the second clock signal;
a first counter configured to count a number of clocks of the second clock signal at a first number of periods of a first frequency-divided signal outputted from the first frequency divider;
a second counter configured to count a number of clocks of the first clock signal at a second number of periods of a second frequency-divided signal outputted from the second frequency divider;
a determination portion configured to determine, based on results of counting by the first counter and the second counter, whether or not an abnormality has occurred in either of the first clock signal and the second clock signal; and
an identification portion configured to identify, at an occurrence of an abnormality in either of the first clock signal and the second clock signal, which of the first clock signal and the second clock signal is in an abnormal state.

2. The monitoring circuit according to claim 1, wherein the identification portion includes:
    a third oscillator configured to output a third clock signal; and
    a third counter configured to count a number of clocks of the third clock signal at a third number of periods of the second frequency-divided signal or a fourth number of periods of the first frequency-divided signal, and
the identification portion is configured to identify, based on results of counting by the first counter, the second counter, and the third counter, at the occurrence of an abnormality in either of the first clock signal and the second clock signal, which of the first clock signal and the second clock signal is in the abnormal state.

3. The monitoring circuit according to claim 2, wherein
the first oscillator is configured to oscillate based on a first reference voltage supplied from a first reference voltage source, and
the second oscillator is configured to oscillate based on a second reference voltage supplied from a second reference voltage source.

4. The monitoring circuit according to claim 3, wherein
the third counter is configured to count the number of clocks of the third clock signal at the third number of periods of the second frequency-divided signal, and the third oscillator is configured to oscillate based on the first reference voltage, or
the third counter is configured to count the number of clocks of the third clock signal at the fourth number of periods of the first frequency-divided signal, and the third oscillator is configured to oscillate based on the second reference voltage.

5. The monitoring circuit according to claim 1, wherein
the identification portion includes at least one of a first charging and discharging circuit configured to perform charging and discharging based on the first clock signal and a second charging and discharging circuit configured to perform charging and discharging based on the second clock signal, and
the identification portion is configured to identify, based on an output of at least one of the first charging and discharging circuit and the second charging and discharging circuit, at the occurrence of an abnormality in either of the first clock signal and the second clock signal, which of the first clock signal and the second clock signal is in the abnormal state.

6. The monitoring circuit according to claim 5, wherein
the first oscillator is configured to oscillate based on a first reference voltage supplied from a first reference voltage source, and
the second oscillator is configured to oscillate based on a second reference voltage supplied from a second reference voltage source.

7. The monitoring circuit according to claim 1, further comprising:
    a selector configured to select either one of the first clock signal and the second clock signal.

8. The monitoring circuit according to claim 7, wherein
upon determination by the determination portion that an abnormality has occurred in either of the first clock signal and the second clock signal, based on a result of identification by the identification portion, the selector selects a normal-state clock signal from the first clock signal and the second clock signal.

9. A semiconductor integrated circuit device comprising the monitoring circuit according to claim 1.

10. A vehicle comprising the monitoring circuit according to claim 1.

* * * * *